(12) United States Patent
Holm et al.

(10) Patent No.: US 7,600,548 B2
(45) Date of Patent: Oct. 13, 2009

(54) METHOD AND APPARATUS FOR APPLYING VISCOUS MEDIUM ONTO A SUBSTRATE

(75) Inventors: William Holm, Stockholm (SE); Nils Jacobsson, Järfälla (SE)

(73) Assignee: Mydata Automation AB, Bromma (SE)

( * ) Notice: Subject to any disclaimer, the term of this patent is extended or adjusted under 35 U.S.C. 154(b) by 130 days.

(21) Appl. No.: 11/502,477

(22) Filed: Aug. 11, 2006

(65) Prior Publication Data

US 2007/0137558 A1 Jun. 21, 2007

Related U.S. Application Data

(62) Division of application No. 09/901,592, filed on Jul. 11, 2001.

(30) Foreign Application Priority Data

Jul. 11, 2000 (SE) .................................. 0002619

(51) Int. Cl.
*B32B 37/12* (2006.01)
*B05C 11/10* (2006.01)

(52) U.S. Cl. ...................... 156/356; 118/669
(58) Field of Classification Search ............... 156/669, 156/712, 713, 313, 314, 665, 679, 356, 357; 118/669, 712, 713, 313, 314, 665, 679, 212, 118/213, 225; 101/125, 162
See application file for complete search history.

(56) References Cited

U.S. PATENT DOCUMENTS

| | | | |
|---|---|---|---|
| 3,580,462 A | 5/1971 | Vanyi | |
| 3,689,987 A | 9/1972 | Teague | |
| 3,738,760 A | 6/1973 | Madeira | |
| 3,962,487 A | 6/1976 | Fuller et al. | |
| 4,239,827 A | 12/1980 | Notaro | |
| 4,660,771 A | 4/1987 | Chabert et al. | |
| 5,108,024 A | 4/1992 | Kazem-Goudarzi et al. | |
| 5,151,299 A | 9/1992 | Itsuji | |
| 5,155,904 A * | 10/1992 | Majd | 29/837 |
| 5,159,171 A * | 10/1992 | Cook et al. | 219/121.63 |
| 5,320,250 A | 6/1994 | La et al. | |
| 5,505,777 A | 4/1996 | Ciardella et al. | |
| 5,558,504 A | 9/1996 | Stridsberg | |
| 5,574,801 A | 11/1996 | Collet-Beillon | |
| 5,711,989 A | 1/1998 | Ciradella et al. | |
| 5,714,195 A * | 2/1998 | Shiba et al. | 427/140 |
| 5,740,729 A | 4/1998 | Hikita et al. | |
| 5,839,188 A | 11/1998 | Pommer | |
| 5,912,732 A | 6/1999 | Sekine | |
| 5,913,455 A | 6/1999 | La et al. | |
| 5,947,022 A | 9/1999 | Freeman et al. | |
| 6,026,176 A | 2/2000 | Whitman | |
| 6,033,503 A | 3/2000 | Radowicz et al. | |
| 6,036,994 A | 3/2000 | Tanaka et al. | |
| 6,100,787 A | 8/2000 | Huang et al. | |
| 6,179,938 B1 * | 1/2001 | Mannhart et al. | 156/64 |
| 6,264,097 B1 | 7/2001 | Sano | |

(Continued)

FOREIGN PATENT DOCUMENTS

JP     2200376     8/1990

(Continued)

OTHER PUBLICATIONS

Article by Robert Kirkpatrick—"Two-Dimensional, Closed-loop Inspection of Stencil Printing"—published in SMT/Jul. 1999.

*Primary Examiner*—George R Koch, III
(74) *Attorney, Agent, or Firm*—Birch, Stewart, Kolasch & Birch, LLP

(57) ABSTRACT

The invention relates to the screen printing of viscous medium onto a substrate and the subsequent application of additional viscous medium through jetting.

16 Claims, 3 Drawing Sheets

U.S. PATENT DOCUMENTS

| | | |
|---|---|---|
| 6,350,494 B1 | 2/2002 | Farnworth |
| 6,411,545 B1 | 6/2002 | Caywood |
| 6,450,416 B1 | 9/2002 | Berg et al. |
| 6,479,120 B2 * | 11/2002 | Miyaji .................. 428/46 |
| 6,541,063 B1 | 4/2003 | Prentice et al. |
| 6,613,240 B2 | 9/2003 | Skinner et al. |
| 6,692,095 B1 | 2/2004 | Marumoto et al. |
| 2002/0014602 A1 | 2/2002 | Holm et al. |

FOREIGN PATENT DOCUMENTS

| | | |
|---|---|---|
| JP | 4-239797 A | 8/1992 |
| WO | WO-99/24211 | 5/1999 |
| WO | WO-99/64167 | 12/1999 |
| WO | WO-00/42381 A1 | 7/2000 |

* cited by examiner

METHOD AND APPARATUS FOR APPLYING VISCOUS MEDIUM ONTO A SUBSTRATE

This application is a Divisional of co-pending Application No. 09/901,592, filed on Jul. 11, 2001, the entire contents of which are hereby incorporated by reference and for which priority is claimed under 35 U.S.C. §120.

TECHNICAL FIELD OF THE INVENTION

The present invention generally relates to the field of providing substrates with viscous medium. More specifically, the invention relates to a method of applying a viscous medium on a substrate, said method comprising the step of screen printing predetermined amounts of the viscous medium on predetermined positions on the substrate; an apparatus for application of a viscous medium onto a substrate, said apparatus comprising a screen printer for screen printing predetermined amounts of the viscous medium on predetermined positions on the substrate; and an apparatus for application of additional viscous medium onto a screen printed substrate.

BACKGROUND OF THE INVENTION

The most common method of applying viscous medium, such as solder paste, to a substrate, such as a PCB, in electronics production is by using screen printing. The vast majority of viscous medium deposits can be applied by this method. However, in specific circumstances there is a need for different viscous mediums at different locations on the substrate. This poses a problem, since there are a number of difficulties to overcome when adding viscous medium by performing an extra screen printing procedure, after an initial application of viscous medium. Further, it is sometimes desired to produce patterns of viscous medium that are very difficult to achieve through screen printing, such as the pattern of an unfilled circle.

It can also be desired that the applied viscous medium presents different heights at different positions on the substrate in order to accommodate, e.g., chip components having different heights, components having different lead angle accuracy, or co-planarity requirements. A solution to the latter problem that has been suggested in the art is to use so called stepped stencils for the screen printing. However, these stencils present a number of drawbacks that have prevented widespread use of this solution.

Also, the application of very small deposits, primarily circular, i.e. dots, of viscous medium is not possible to obtain through screen printing, since the adhesion forces from the stencil would become to great in comparison to the adhesion forces from the substrate. As a consequence, very small deposits would attach to and follow the stencil when the stencil is removed. It could be imagined that this problem is overcome by using a thinner stencil. However, that would have undesired drawbacks in that it would result in an overall decrease of the height of the deposits, and thus the overall volume, which is undesired and would pose a problem for larger deposits.

According to the state of the art, efforts have been made to solve the above stated problems by using a conventional dispensing equipment. By using a conventional dispenser it is possible to add viscous medium following an initial screen printing of the substrate for producing said patterns of viscous medium that are not easily achieved through screen printing. With a conventional dispenser it can also be possible to apply viscous medium having different height at different locations on the board. However, the conventional dispensers have a number of disadvantages. The process of conventional dispensing of viscous medium is relatively slow, the application of very small deposits of viscous medium through conventional dispensing is difficult, and it is also difficult to apply additional viscous medium onto a location on the substrate that has already been provided with viscous medium.

SUMMARY OF THE INVENTION

Thus, an object of the present invention is to provide a solution to the above stated problems in relation to the application of additional viscous medium to a substrate that already has been subject to initial application of viscous medium through screen printing.

This and other objects are achieved according to the present invention by providing a method and an apparatus as described below.

According to a first aspect of the invention, there is provided a method of applying viscous medium on a substrate, comprising the steps of screen printing predetermined amounts of the viscous medium on predetermined positions on the substrate, and add-on jetting of predetermined additional amounts of viscous medium on predetermined positions on the screen printed substrate.

According to a second aspect of the invention, there is provided an apparatus for application of a viscous medium onto a substrate, comprising a screen printer for screen printing predetermined amounts of the viscous medium on predetermined positions on the substrate, and a jetting device for jetting predetermined additional amounts of viscous medium on predetermined positions on the screen printed substrate.

According to a third aspect of the invention, there is provided an apparatus for application of additional viscous medium onto a screen printed substrate, comprising a jetting device for jetting said additional amounts of viscous medium on predetermined positions on the substrate.

According to a fourth aspect of the invention, there is provided a method of applying viscous medium on a substrate comprising the steps of screen printing viscous medium onto the substrate, and jetting additional viscous medium onto the substrate.

According to a fifth aspect of the invention, there is provided a method of applying additional viscous medium on a screen printed substrate, comprising the step of jetting additional viscous medium onto the substrate.

For the purposes of this application, it is to be noted that the term "viscous medium" should be interpreted as solder paste, flux, adhesive, conductive adhesive, or any other kind of medium used for fastening components on a substrate, or resistive paste; and that the term "substrate" should be interpreted as a printed circuit board (PCB), a substrate for ball grid arrays (BGA), chip scale packages (CSP), quad flat packages (QFP), and flip-chips or the like. It is also to be noted that the term "jetting" should be interpreted as a non-contact dispensing process that utilises a fluid jet to form and shoot droplets of a viscous medium from a jet nozzle onto a substrate, e.g. as described in the published International Application WO 99/64167, as compared to a contact dispensing process, such as "fluid wetting", which is the act of the viscous medium leaving the dispense tip, contacting and clinging to the substrate and remaining on the substrate as the dispense tip pulls away. Further, the term "add-on" refers herein to the application of additional viscous medium, i.e. not the initial application.

Thus, the present invention is based on the advantageous idea of using add-on jetting for the application of additional viscous medium onto a substrate onto which viscous medium previously has been applied through screen printing.

The use of jetting overcomes a number of the above stated problems relating to screen printing. First, jetting enables the application of viscous medium of a different type or sort than what has been initially applied. The use of jetting also enables the application of viscous medium in any desired pattern, which is not possible through screen printing. The application of viscous medium of varying height is also achievable through jetting. Also, jetting is advantageous to conventional dispensing in that it is faster, more accurate, and more flexible. In fact, the use of conventional dispensing often provide a bottle neck that increases the cycle time in the overall component mounting process, as compared to the use of jetting. It has also been found that it is possible to achieve smaller dots when using jetting than when using conventional dispensing.

Further, one of the main advantages obtained by using jetting for applying additional viscous medium onto a screen printed substrate, is that it is possible to apply viscous medium at positions where viscous medium already has been applied. Thereby, it will be possible to easily increase the height of the applied viscous medium at a specific location without any danger of the nozzle of the jetting device being smeared by the viscous medium already applied on the substrate.

According to a specific embodiment of the present invention, the results of the application of viscous medium onto the substrate is inspected, errors of the application is determined based on said inspection, and at least some of said errors are corrected, wherein said correction comprises jetting of additional viscous medium onto the substrate. This means that not only the predetermined additional amounts of viscous medium is applied onto the substrate through jetting, but also any additional amount of viscous medium that is determined to be required as a result of errors in the regular viscous medium application.

Said inspection can be performed between the screen printing and the add-on jetting of viscous medium, following the add-on jetting of viscous medium, or both. If the inspection is performed between the screen printing and the add-on jetting, the predetermined add-on jetting can be combined with the correction jetting, either by determining the positions where jetting is required and the amount, or by performing the add-on jetting and the jetting correction in sequence.

Preferably, a single jetting device performs both the add-on jetting and the jetting correction, which decreases the physical complexity of the system. Alternatively, this is performed by a separate jetting device.

When the inspection is performed following the add-on jetting only, the correction can be performed in a separate machine. This decreases the cycle time for the overall viscous medium application process, but increases the line length. If a separate machine is used for the jetting correction, the inspection, evaluation and determination of errors is preferably, but not necessarily, performed in the same machine.

According to a further embodiment of the invention, the correction of applied viscous medium also comprises the removal of surplus viscous medium. Preferably, this is performed at specific locations on the substrate only, at which the inspection has revealed that too much viscous medium has been applied. This can refer to the amount of viscous medium for a given location, the height of the applied viscous medium, the applied viscous medium being offset from the intended position, or that viscous medium has been applied at a position where it was not supposed to.

According to a further embodiment of the present invention, following the inspection of a substrate, an evaluation is performed to determine whether the number or the severity of detected errors are such that correction of applied viscous medium is worthwhile. Such an evaluation can be performed regardless of whether the inspection is performed before or after the add-on jetting of additional viscous medium. That is, if there are a large number of corrective actions required, then it might be more economical to simply discard the substrate. This is of course dependent on the type of substrate and the cost involved for the substrate. If correction is not deemed worthwhile, the substrate is preferably cleaned from any applied viscous medium and reused. On the other hand, if cleaning the substrate is not considered economical, the substrate is preferably discarded.

It should be noted that the screen printing and the subsequent jetting of viscous medium is for the purposes of this application not limited to the use of one viscous medium for both the screen printing and the jetting. Consequently, a number of different types and sorts of viscous medium can be used. For instance, the screen printing is performed for a viscous medium, then add-on jetting of another viscous medium is performed. Additionally, the subsequent jetting, the add-on jetting and/or the correction jetting, can be performed in sequences with different sorts of viscous medium. Then, more than one jetting device is preferably used to avoid unwanted mixing of the different viscous medium and/or to avoid increased cycle time due to change of the viscous medium supply and possible cleaning of the jetting device.

The above mentioned and other aspects, advantages, and features of the invention will be more fully understood from the following description of exemplifying embodiments thereof.

BRIEF DESCRIPTION OF THE DRAWINGS

Exemplifying embodiments of the invention will be described below with reference to the accompanying drawings, in which.

DETAILED DESCRIPTION OF PREFERRED EMBODIMENTS

Figure 1:
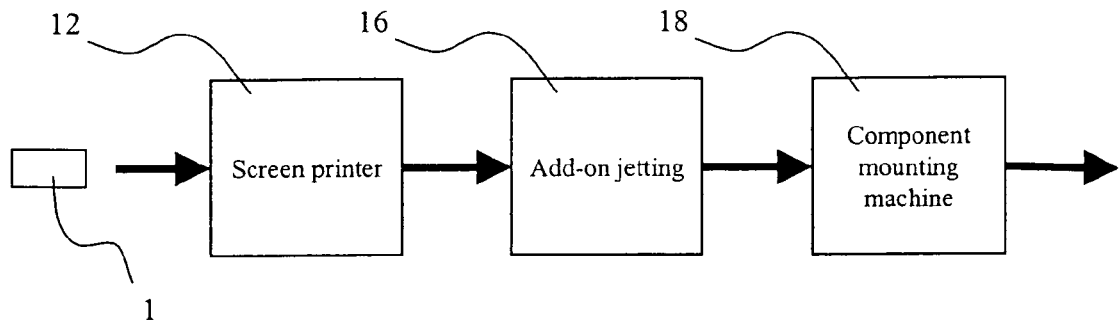
FIGS. 1-3 are block diagrams illustrating arrangements according to alternative embodiments of the present invention.
Figure 2:
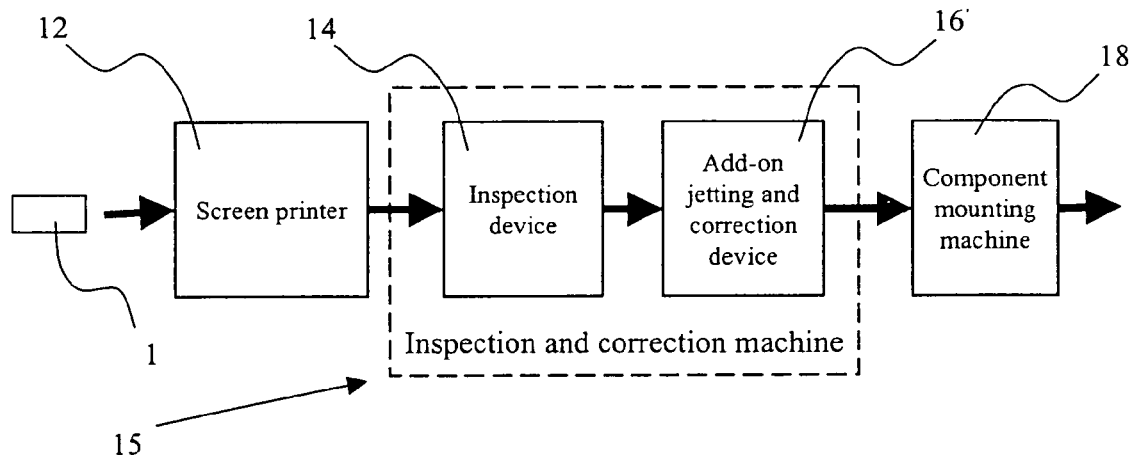
Figure 3:
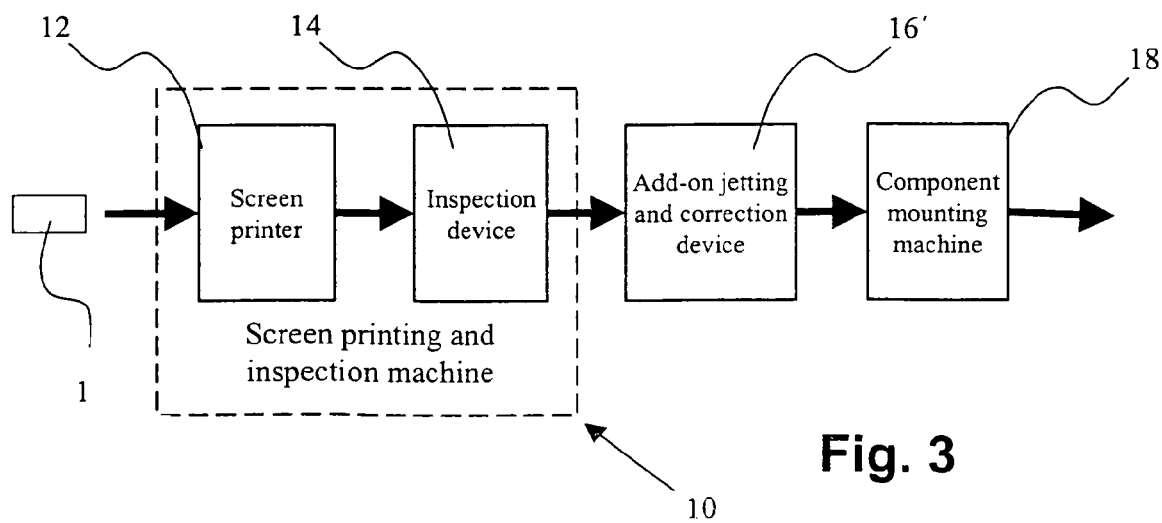

In the block diagrams of FIGS. 1-3, the thick-lined arrows depict the movement of a substrate 1 through the production line. The dashed boxes simply indicate that the device(s) or apparatus(es) depicted within the box can be incorporated in a single machine.

With reference to FIGS. 1-6, there are illustrated exemplary embodiments of the present invention. As to the specific apparatuses used for screen printing, jetting, inspection of application results, removing solder paste, and component mounting, use can be made of suitable apparatuses which by themselves are known within the art, and the constructional features of which are also known. Therefore, detailed constructional and functional description of each separate apparatus have been omitted. Furthermore, the viscous medium of the description of exemplary embodiments below is solder paste. However, the invention is not restricted to using solder paste. On the contrary, any type of viscous medium can be used.

Figure 4:
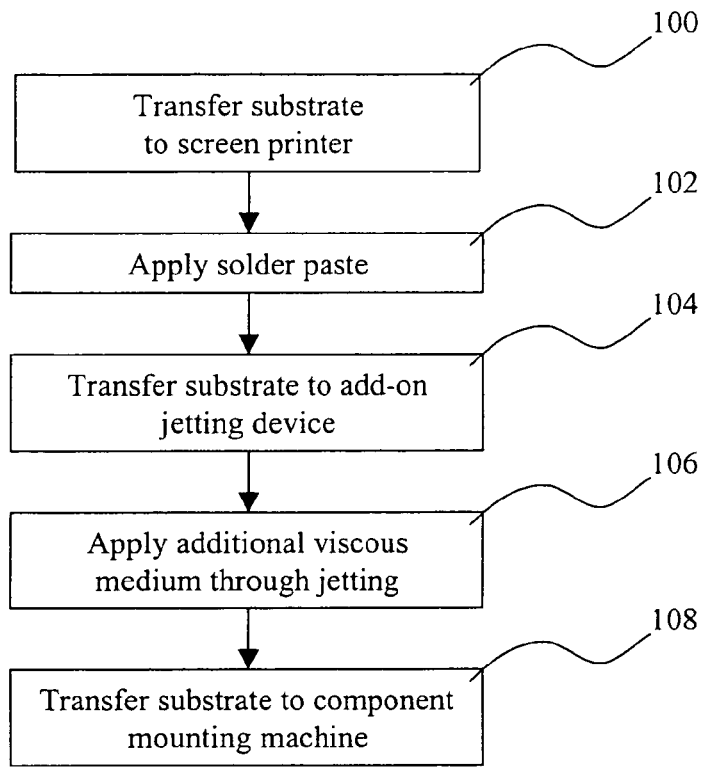
FIGS. 4-6 illustrate in flow chart form the alternative embodiments shown in FIGS. 1-3.

Turning first to FIGS. 1 and 4, there is shown a first exemplary embodiment of the present invention. A substrate 1 is at step 100 transferred to a screen printer 12 where an initial application of solder paste is performed, at step 102. Then, the substrate 1 is transferred at step 104 to a machine 16 for performing add-on jetting of additional amounts of solder paste, at step 106. The amounts, patterns, heights, type of solder paste, etc., that is added onto the substrate 1 is predetermined. Thus, there is no inspection if the screen printing results performed prior to the jetting of additional solder paste. Following the add-on jetting step, the substrate 1 is at step 108 transferred to a component mounting machine 18, where electrical components are mounted on the substrate 1. As an alternative, there may be included a step of inspecting the final results of the combined solder paste application, i.e. both the screen printing and the add-on jetting.

Figure 5:
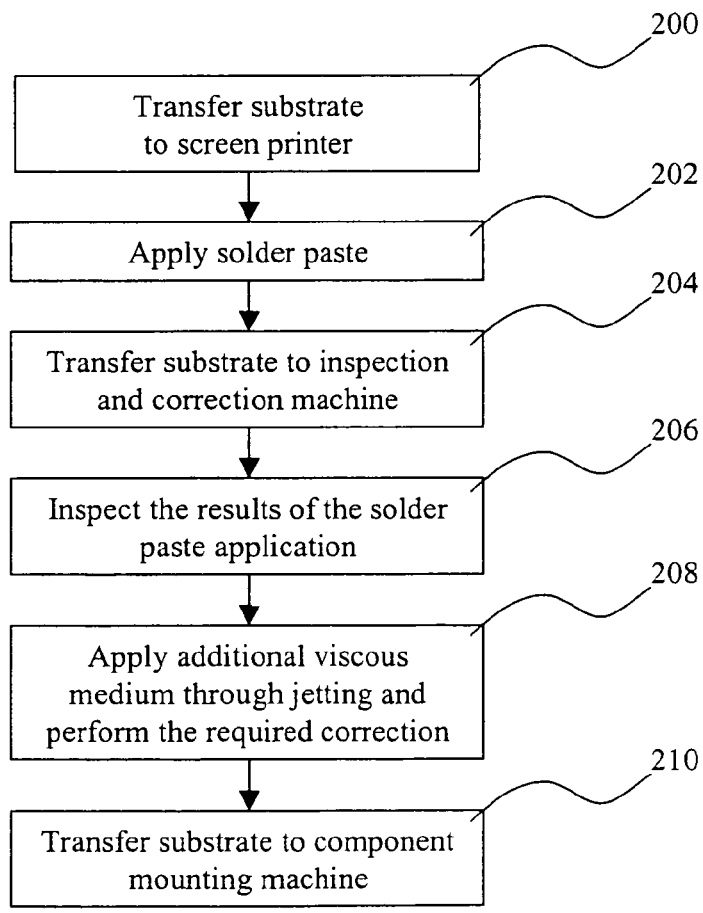

With reference now to FIGS. 2 and 5, there is shown another exemplary embodiment of the present invention. This embodiment also includes an inspection device 14 provided for inspection of the screen printing results. Following screen printing at step 202, the substrate is at step 204 transferred to the inspection device 14 that performs the inspection at step 206. The results of the inspection is recorded and relayed to the device 16' for performing the add-on jetting. With the information as to the results of said inspection, the jetting device 16' can also perform any required jetting of additional solder paste onto positions on the substrate where insufficient amounts have been applied due to some error in the initial screen printing. Thus, the jetting device 16' is a combined add-on jetting and correction device 16'. Further, according to this embodiment, the add-on jetting and correction device 16' can also comprise a device for removing amounts of solder paste from the substrate. According to this embodiment, the removal is performed through suction of the solder paste at the selected position of the substrate. If the inspection reveals that correction of the substrate 1 is not worthwhile, the substrate 1 is passed by the add-on jetting and correction device 16' without any measures taking place. Then, the substrate 1 is simply taken out of the production line before reaching the component mounting machine 18.

The inspection device 14 is preferably incorporated in the same machine as the add-on jetting and correction device 16', thus forming a combined inspection and correction machine 15. Then, the inspection device 14 could be used to inspect the result of the add-on jetting to further minimise the application errors on the substrate. However, the inspection device 14 can naturally also be a separate machine.

Following the correction and add-on jetting, at step 208, the substrate is transferred to the component mounting machine 18, at step 210.

Figure 6:
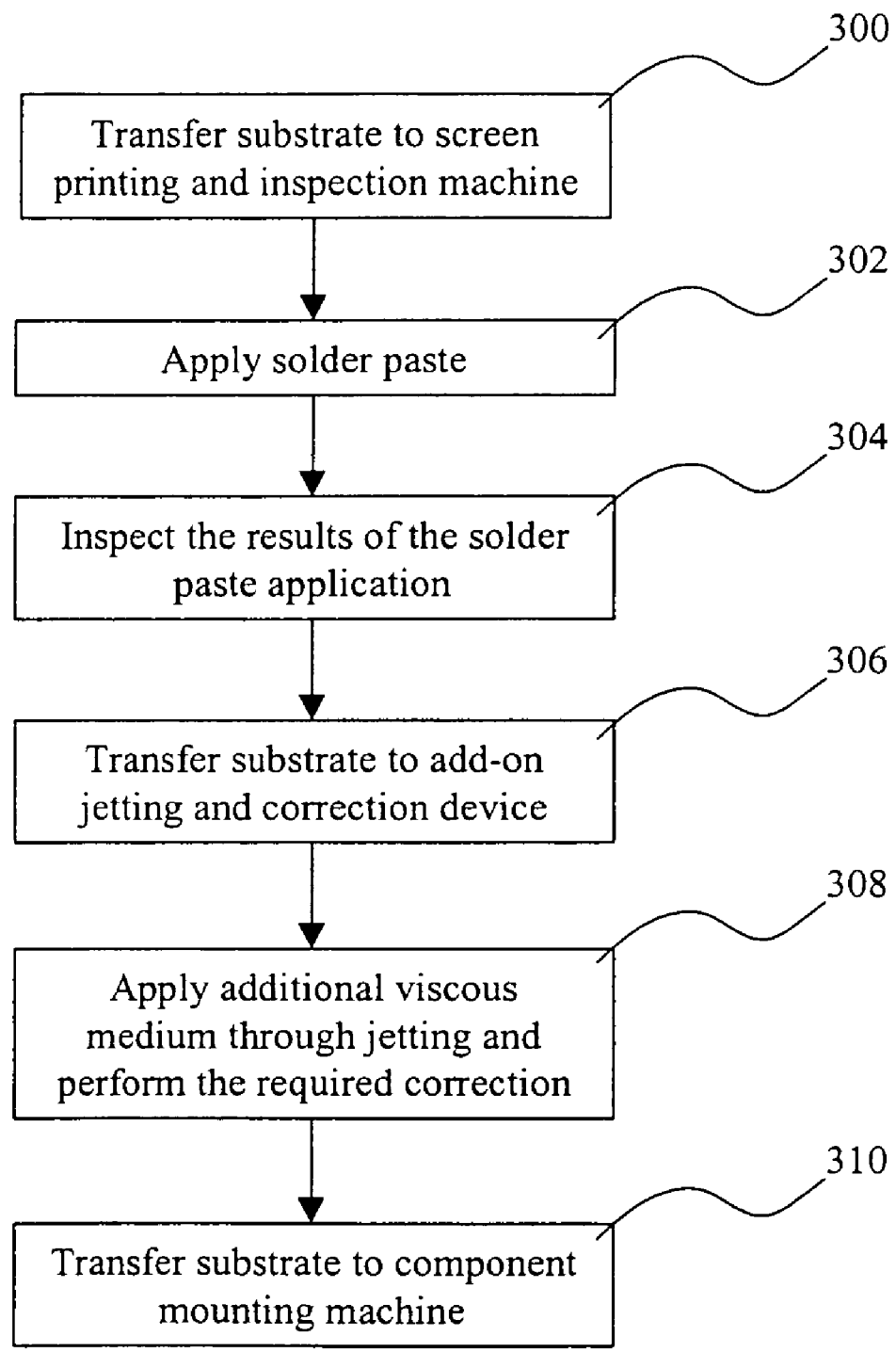

Finally, the block diagram of FIG. 3 and the flow chart of FIG. 6 illustrate yet another exemplary embodiment of the present invention. Here, the screen printer 12 and the inspection device 14 is incorporated in a single machine 10. Following the screen printing of the substrate 1 and the subsequent inspection of the screen printing results in the combined screen printing and inspection machine 10, at steps 300-304, the substrate 1 is transferred to an add-on jetting and correction device 16'. The add-on jetting and correction device 16' have the similar features as do the corresponding device 16' of FIG. 2. When the substrate enters the add-on jetting and correction device 16', said device 16' has received information as to the required corrections, if any, to be performed on the substrate 1. The additional solder paste is then added and any application errors corrected, at step 308, and the substrate 1 is transferred at step 310 to the component mounting machine 18. Again, if the inspection reveals that the substrate 1 is provided with a number of errors resulting from the screen printing, and that correction is deemed not to be worthwhile, the substrate 1 is taken out of the production line. In this embodiment, this is performed before the substrate 1 reaches the add-on jetting and correction device 16'.

As is understood by the man skilled in the art, the above-mentioned steps would require a certain amount of processing, transferring and evaluating information. This, however, can be performed by a conventional processor which is not shown or further described.

Even though the invention has been described above using exemplifying embodiments thereof, alterations, modifications and combinations thereof, as understood by those skilled in the art, may be made within the scope of the invention, which is defined by the accompanying claims.

The invention claimed is:

1. An apparatus for application of a viscous medium and electronic components onto a substrate, comprising:
   a screen printer configured to screen print predetermined amounts of the viscous medium on predetermined positions on the substrate; and
   a jetting device configured to jet predetermined additional amounts of viscous medium on predetermined positions on the screen printed substrate, the predetermined additional amounts and predetermined positions being determined prior to screen printing; and
   a component mounting machine for mounting the electrical components on the substrate,
   wherein the jetting device is a non-contact dispensing device that jets the predetermined amounts of viscous medium while the viscous medium is still in viscous form.

2. The apparatus according to claim 1, further comprising:
   an inspection device configured to inspect the results of said screen printing and jetting;
   a processor configured to determine errors of said screen printing and jetting based on said inspection; and
   a correction device configured to correct at least some of said errors,
   wherein said correction device comprises a supplemental jetting device arranged for jetting of supplemental amounts of viscous medium onto the screen printed substrate, and the supplemental jetting device is different from the jetting device.

3. The apparatus according to claim 1, further comprising:
   an inspection device configured to inspect the results of said screen printing;
   a processor configured to determine errors of said screen printing based on said inspection; and
   a correction device configured to correct at least some of said errors,
   wherein said correction device comprises a supplemental jetting device arranged for jetting of supplemental amounts of viscous medium onto the screen printed substrate, and the supplemental jetting device is different from the jetting device.

4. The apparatus according to claim 2 or 3, wherein the correction device comprises a removing device configured to remove viscous medium from the screen printed substrate.

5. A system for application of a viscous medium and electronic components onto a screen printed substrate, comprising:
   the screen printed substrate;
   a jetting device configured to jet predetermined additional amounts of viscous medium on predetermined positions on the screen printed substrate; and a component mounting machine for mounting the electrical components on the substrate.

wherein the jetting device is a non-contact dispensing device that jets the predetermined amounts of viscous medium while the viscous medium is still in viscous form.

6. The system according to claim 5, further comprising:

an inspection device configured to inspect the results of said screen printing and jetting;

a processor configured to determine errors of said screen printing and jetting based on said inspection; and a correction device configured to correct at least some of said errors, wherein said correction device comprises a supplemental jetting device arranged for jetting of supplemental amounts of viscous medium onto the screen printed substrate, and the supplemental jetting device is different from the jetting device.

7. The system according to claim 5, further comprising:

an inspection device configured to inspect the results of said screen printing;

a processor configured to determine errors of said screen printing based on said inspection; and a correction device configured to correct at least some of said errors, wherein said correction device comprises a supplemental jetting device arranged for jetting of supplemental amounts of viscous medium onto the screen printed substrate and the supplemental jetting device is different from the jetting device.

8. The system according to claim 6 or 7, wherein the correction device comprises a removing device configured to remove viscous medium from the screen printed substrate.

9. The apparatus according to claim 1, further comprising:

an inspection device configured to inspect the results of said screen printing and jetting;

a processor configured to determine errors of said screen printing and jetting based on said inspection; and a correction device configured to correct at least some of said errors, wherein said correction device comprises a supplemental jetting device arranged for jetting of supplemental amounts of viscous medium onto the screen printed substrate, and the supplemental jetting device is the same as the jetting device.

10. The apparatus according to claim 1, further comprising:

an inspection device configured to inspect the results of said screen printing;

a processor configured to determine errors of said screen printing based on said inspection; and a correction device configured to correct at least some of said errors, wherein said correction device comprises a supplemental jetting device arranged for jetting of supplemental amounts of viscous medium onto the screen printed substrate, and the supplemental jetting device is the same as the jetting device.

11. The apparatus according to claim 9 or 10, wherein the correction device comprises a removing device configured to remove viscous medium from the screen printed substrate.

12. The system according to claim 5, further comprising:

an inspection device configured to inspect the results of said screen printing and jetting;

a processor configured to determine errors of said screen printing and jetting based on said inspection; and a correction device configured to correct at least some of said errors, wherein said correction device comprises a supplemental jetting device arranged for jetting of supplemental amounts of viscous medium onto the screen printed substrate, and the supplemental jetting device is the same as the jetting device.

13. The system according to claim 5, further comprising:

an inspection device configured to inspect the results of said screen printing;

a processor configured to determine errors of said screen printing based on said inspection; and a correction device configured to correct at least some of said errors, wherein said correction device comprises a supplemental jetting device arranged for jetting of supplemental amounts of viscous medium onto the screen printed substrate and the supplemental jetting device is the same as the jetting device.

14. The system according to claim 12 or 13, wherein the correction device comprises a removing device configured to remove viscous medium from the screen printed substrate.

15. The apparatus according to claim 1, wherein there is no inspection device located in the screen printer, between the screen printer and the jetting device or in the jetting device.

16. An apparatus for application of a viscous medium and electronic components onto a substrate, comprising:

a screen printer configured to screen print predetermined amounts of the viscous medium on predetermined positions on the substrate; and a jetting device downstream from the screen printer and configured to jet predetermined additional amounts of viscous medium on predetermined positions on the screen printed substrate, the predetermined additional amounts and predetermined positions being determined prior to screen printing; and a component mounting machine for mounting the electrical components on the substrate, wherein there is no inspection device located between the screen printer and the jetting device to inspect the results of the screen printing, and the jetting device is a non-contact dispensing device that jets the predetermined amounts of viscous medium while the viscous medium is still in viscous form.

* * * * *